(12) United States Patent
Jeong et al.

(10) Patent No.: US 10,211,430 B2
(45) Date of Patent: Feb. 19, 2019

(54) METHOD OF MANUFACTURING ORGANIC LIGHT-EMITTING DISPLAY DEVICE

(71) Applicant: Samsung Display Co., Ltd., Yongin-si (KR)

(72) Inventors: Sehoon Jeong, Yongin-si (KR); Jaesik Kim, Yongin-si (KR); Jaeik Kim, Yongin-si (KR); Yeonhwa Lee, Yongin-si (KR); Joongu Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/803,131

(22) Filed: Nov. 3, 2017

(65) Prior Publication Data

US 2018/0358584 A1 Dec. 13, 2018

(30) Foreign Application Priority Data

Jun. 8, 2017 (KR) .................. 10-2017-0071736

(51) Int. Cl.
*H01L 51/56* (2006.01)
*H01L 27/32* (2006.01)
*H01L 51/50* (2006.01)

(52) U.S. Cl.
CPC .......... *H01L 51/56* (2013.01); *H01L 27/3244* (2013.01); *H01L 27/3246* (2013.01); *H01L 51/508* (2013.01); *H01L 51/5012* (2013.01); *H01L 51/5064* (2013.01)

(58) Field of Classification Search
CPC .. H01L 51/56; H01L 27/3246; H01L 27/3244
See application file for complete search history.

(56) References Cited

U.S. PATENT DOCUMENTS

| 6,146,715 A | 11/2000 | Kim et al. |
| 6,948,533 B2 * | 9/2005 | Seki ............... B41J 25/003 141/1 |
| 7,022,534 B2 * | 4/2006 | Gupta ............. H01L 27/3211 257/40 |

(Continued)

FOREIGN PATENT DOCUMENTS

| JP | 2000-012220 | 1/2000 |
| JP | 2000-021578 | 1/2000 |
| KR | 10-2017-0018235 | 2/2017 |

*Primary Examiner* — Bac Au
(74) *Attorney, Agent, or Firm* — H.C. Park & Associates, PLC

(57) ABSTRACT

A method of manufacturing an organic light-emitting display device includes: preparing a substrate including pixel electrodes; forming a pixel defining layer on the substrate, the pixel defining layer exposing a central portion of each of the pixel electrodes and covering an edge portion of each of the pixel electrodes; forming partitioning walls in correspondence with at least a portion of an upper surface of the pixel defining layer, the partitioning walls including a first resin; removing a solvent in the partitioning walls by baking the partitioning walls; forming a first mask layer filling a space between the partitioning walls and exposing a first pixel electrode among the pixel electrodes, the first mask layer including a second resin; and forming a first intermediate layer on the first pixel electrode.

20 Claims, 11 Drawing Sheets

(56) References Cited

U.S. PATENT DOCUMENTS

| | | | |
|---|---|---|---|
| 8,860,299 B2* | 10/2014 | Seong | H01L 51/5253 |
| | | | 313/483 |
| 9,040,320 B2* | 5/2015 | Park | H01L 51/56 |
| | | | 430/322 |
| 9,111,887 B2* | 8/2015 | Kim | H01L 51/5253 |
| 9,692,020 B2* | 6/2017 | Park | H01L 21/308 |
| 9,893,318 B2* | 2/2018 | Dai | H01L 27/3211 |
| 10,020,447 B2* | 7/2018 | Kim | H01L 51/5225 |
| 2008/0150419 A1* | 6/2008 | Kang | H01L 51/524 |
| | | | 313/504 |
| 2010/0252841 A1* | 10/2010 | Cok | H01L 27/3209 |
| | | | 257/89 |
| 2014/0077189 A1* | 3/2014 | Kugler | B82Y 10/00 |
| | | | 257/40 |
| 2014/0322850 A1 | 10/2014 | Lee et al. | |
| 2015/0001495 A1* | 1/2015 | Choung | C23C 14/048 |
| | | | 257/40 |
| 2015/0044801 A1 | 2/2015 | Lee et al. | |
| 2015/0364685 A1 | 12/2015 | Defranco et al. | |
| 2017/0040397 A1 | 2/2017 | Choe et al. | |
| 2018/0138251 A1* | 5/2018 | Kang | H01L 51/5228 |

* cited by examiner

METHOD OF MANUFACTURING ORGANIC LIGHT-EMITTING DISPLAY DEVICE

CROSS-REFERENCE TO RELATED APPLICATION

This application claims priority from and the benefit of Korean Patent Application No. 10-2017-0071736, filed Jun. 8, 2017, which is hereby incorporated by reference for all purposes as if fully set forth herein.

BACKGROUND

Field

Exemplary embodiments relate to a method of manufacturing an organic light-emitting display device.

Discussion

An organic light-emitting display device, which is a self-luminescent display device, may be driven at a low voltage since a separate light source is unnecessary, may be implemented as a light and thin device, and may exhibit fine characteristics including a wide viewing angle, a high contrast, and a fast response. An organic light-emitting display device utilizes an organic light-emitting element in a display area to display an image. The organic light-emitting element typically includes a pixel electrode and a counter electrode facing each other, and an intermediate layer between the pixel electrode and the counter electrode. The intermediate layer includes an emission layer. In the case of manufacturing such an organic light-emitting display device, various methods may be used for forming at least a portion of an intermediate layer. For example, a deposition method in which an organic material is patterned and used as a mask according to a photo patterning technique may be used.

The above information disclosed in this section is only for understanding the background of the inventive concepts, and, therefore, may contain information that does not form prior art.

SUMMARY

Some exemplary embodiments provide a method of manufacturing an organic light-emitting display device capable of reducing defects during formation of an intermediate layer.

Additional aspects will be set forth in the detailed description which follows, and, in part, will be apparent from the disclosure, or may be learned by practice of the inventive concepts.

According to one or more exemplary embodiments, a method of manufacturing an organic light-emitting display device includes: preparing a substrate including pixel electrodes; forming a pixel defining layer on the substrate, the pixel defining layer exposing a central portion of each of the pixel electrodes and covering an edge portion of each of the pixel electrodes; forming partitioning walls in correspondence with at least a portion of an upper surface of the pixel defining layer, the partitioning walls including a first resin; removing a solvent in the partitioning walls by baking the partitioning walls; forming a first mask layer filling a space between the partitioning walls and exposing a first pixel electrode among the pixel electrodes, the first mask layer including a second resin; and forming a first intermediate layer on the first pixel electrode.

A temperature for baking the partitioning walls may be greater than a thermal damage temperature of the first intermediate layer.

A material property of the second resin may be orthogonal to a material property of the first resin.

One of the first resin and the second resin may be a fluorous solvent-based resin and the other one of the first resin and the second resin may be a non-fluorous solvent-based resin.

The first resin and the second resin may be different resins from among a fluorous solvent-based resin, a hydroxylic solvent-based resin, and a non-polar organic solvent-based resin.

The method may further include: removing the first mask layer; forming a second mask layer filling a space between the partitioning walls and exposing a second pixel electrode from among the pixel electrodes that is different from the first pixel electrode, the second mask layer including a third resin; and forming a second intermediate layer on the second pixel electrode.

A material property of the third resin may be orthogonal to a material property of the first resin.

The method may further include forming, before removing the first mask layer, a first counter electrode on the substrate, the first counter electrode covering the first intermediate layer.

The method may further include forming, before removing the first mask layer, a first protection layer on the first intermediate layer, a material property of the first protection layer being equivalent to a material property of the first resin.

The method may further include: removing the second mask layer; and forming a third intermediate layer on a third pixel electrode, the third pixel electrode being different than the first pixel electrode and the second pixel electrode.

According to one or more exemplary embodiments, a method of manufacturing an organic light-emitting display device includes: preparing a substrate including pixel electrodes; forming a pixel defining layer on the substrate, the pixel defining layer exposing a central portion of each of the pixel electrodes and covering an edge portion of each of the pixel electrodes; forming partitioning walls in correspondence with at least a portion of an upper surface of the pixel defining layer, the partitioning walls including a first resin; baking the partitioning walls; forming a first mask layer filling a space between the partitioning walls and exposing a first pixel electrode among the pixel electrodes, the first mask layer including a second resin; forming, after forming the first mask layer, a first intermediate layer and a first counter electrode on the first pixel electrode; removing the first mask layer after forming the first intermediate layer and the first counter electrode on the first pixel electrode; forming, after removing the first mask layer, a second mask layer filling a space between the partitioning walls and exposing a second pixel electrode among the pixel electrodes that is different from the first pixel electrode, the second mask layer including a third resin; and forming, after forming the second mask layer, a second intermediate layer and a second counter electrode on the second pixel electrode.

A temperature for baking the partitioning walls may be greater than a thermal damage temperature of the first intermediate layer.

A material property of the second resin may be orthogonal to a material property of the first resin.

The first resin may be a fluorous solvent-based resin and the third resin may be a non-fluorous solvent-based resin.

The method may further include: removing the second mask layer after forming the second intermediate layer and the second counter electrode on the second pixel electrode; and forming, after removing the second mask layer, a third intermediate layer and a third counter electrode on a third pixel electrode among the pixel electrodes, the third pixel electrode being different from the first pixel electrode and the second pixel electrode.

The method may further include forming a common electrode covering the first counter electrode, the second counter electrode, and the third counter electrode.

The method may further include forming a thin-film encapsulation layer on the common electrode.

At least some of the partitioning walls may separate the first mask layer and the second mask layer from the first intermediate layer and the second intermediate layer, respectively.

The method may further include forming, before removing the first mask layer, a first protection layer on the first intermediate layer, a material property of the first protection layer may be equivalent to a material property of the first resin.

The substrate may include thin-film transistors; and each pixel electrode among the pixel electrodes may be connected to a thin-film transistor among the thin-film transistors.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
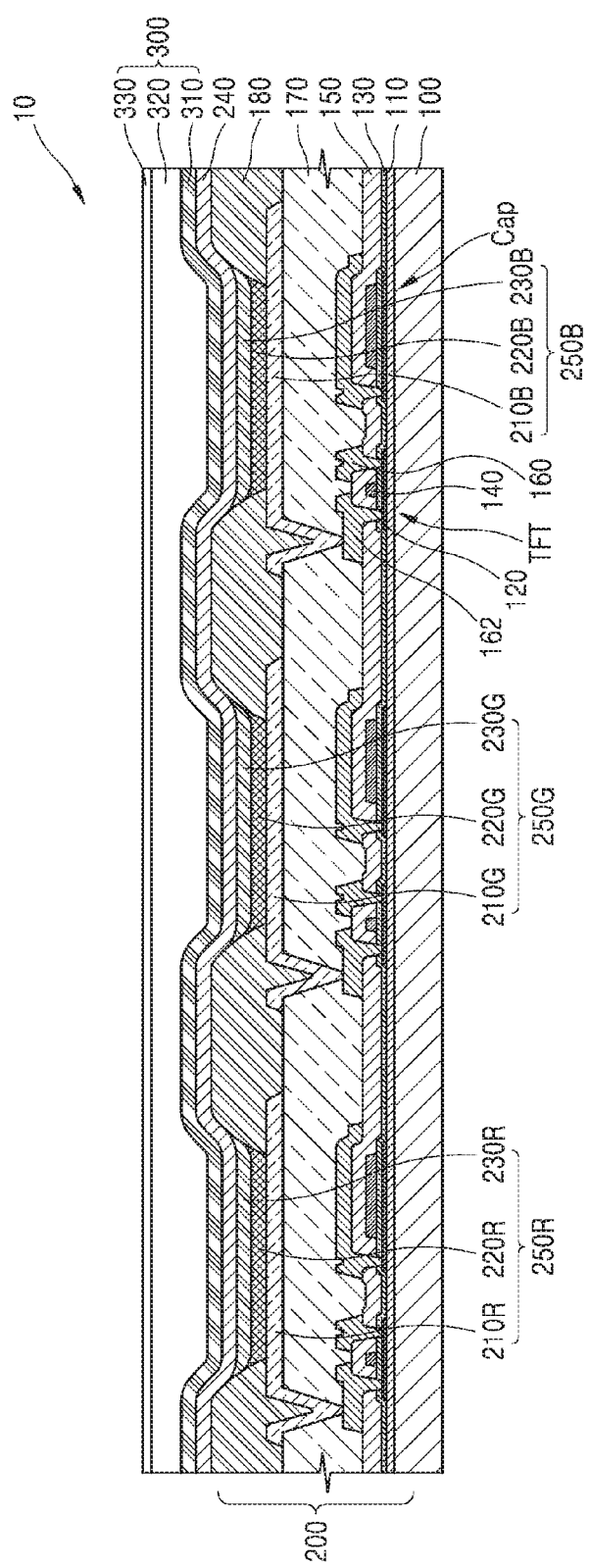
FIG. 1 is a schematic cross-sectional view of an organic light-emitting display device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be implemented in another exemplary embodiment without departing from the spirit and the scope of the disclosure.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as "elements"), of the various illustrations may be otherwise combined, separated, interchanged, and/or rearranged without departing from the spirit and the scope of the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. To this end, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a schematic cross-sectional view of an organic light-emitting display device according to some exemplary embodiments. FIGS. 2 through 11 are schematic cross-sectional views of the organic light-emitting display device of FIG. 1 at various stages of manufacture according to some exemplary embodiments.

Referring to FIGS. 1 through 11, a method of manufacturing an organic light-emitting display device 10 includes preparing a substrate 100 having formed thereon, a plurality of pixel electrodes, for example, first, second, and third pixel electrodes 210R, 210G, and 210B; forming a pixel-defining film (or layer) 180 exposing center (or central) portions of the plurality of pixel electrodes 210R, 210G, 210B and covering edge portions of the plurality of pixel electrodes 210R, 210G, 210B; forming a plurality of partitioning walls 191 using a first resin in correspondence with at least a portion of a top surface of the pixel defining layer 180; removing a solvent in the partitioning walls 191 by baking the plurality of partitioning walls 191; forming a first mask layer 410 using a second resin so as to expose the first pixel electrode 210R among the first, second, and third pixel electrodes 210R, 210G, and 210B; and forming a first intermediate layer 220R on the first pixel electrode 210R.

The first, second, and third pixel electrodes 210R, 210G, and 210B may be electrically connected to a plurality of thin-film transistors TFT formed on the substrate 100, and capacitors Cap may be formed on the substrate 100 together with the plurality of thin-film transistors TFT. Each of the plurality of thin-film transistors TFT may include an active layer 120, a gate electrode 140, a source electrode 160, and a drain electrode 162.

Hereinafter, a method of forming the plurality of thin-film transistors TFT and the first, second, and third pixel electrodes 210R, 210G, and 210B on the substrate 100 and electrically connected to the plurality of thin-film transistors TFT will be described.

The substrate 100 may include (or be formed of) various materials, such as a glass material, a metal material, or a plastic material, such as at least one of polyethylene terephthalate (PET), polyethylene naphthalate (PEN), and polyimide (PI). The substrate 100 may have a flexible or bendable characteristic. The substrate 100 may additionally or alternatively have a ridged characteristic. The substrate 100 may also include a single layer structure or multilayered structure including the above-stated materials.

A buffer layer 110 may be formed on the substrate 100 to prevent or at least reduce (hereinafter, the phrases "prevent" and "at least reduce" may be collectively referred to as "prevent") impurities from permeating into the active layer 120 of the thin-film transistor TFT. The buffer layer 110 may include an inorganic material, such as at least one of silicon oxide, silicon nitride, silicon oxynitride, aluminum oxide, aluminum nitride, titanium oxide, and titanium nitride, or an organic material, such as at least one of polyimide, polyester, and acryl. The buffer layer 110 may include a stacked structure including a plurality of layers of the above-stated material or a single layer structure. According to some exemplary embodiments, the buffer layer 110 may have a triple layer structure including silicon oxide/silicon nitride/silicon oxide.

The buffer layer 110 may be deposited using various deposition methods, such as plasma enhanced chemical vapor deposition (PECVD), atmospheric pressure CVD (APCVD), and low pressure CVD (LPCVD); however, any suitable process may be utilized.

The active layer 120 may include an inorganic semiconductor, such as silicon, an organic semiconductor, or an oxide semiconductor material, and may be formed on the buffer layer 110. Although not illustrated, the active layer 120 includes a source region, a drain region, and a channel region between the source region and the drain region. For example, when the active layer 120 is formed using amorphous silicon, an amorphous silicon layer is formed on the entire surface of the substrate 100, a polycrystalline silicon layer is formed by crystallizing the amorphous silicon layer, the polycrystalline silicon layer is patterned, and a source region and a drain region at edges of the polycrystalline silicon layer are doped with impurities, thereby forming the active layer 120 including the source region, the drain region, and the channel region between the source region and the drain region.

A gate insulating layer 130 is formed on the active layer 120. The gate insulating layer 130 insulates the active layer 120 from the gate electrode 140, and may include a material, such as at least one of silicon oxide, silicon nitride, and silicon oxynitride.

The gate electrode 140 may be formed on the gate insulating layer 130 to overlap the active layer 120. The gate electrode 140 may include a metal, such as at least one of aluminum (Al), platinum (Pt), palladium (Pd), silver (Ag), magnesium (Mg), gold (Au), nickel (Ni), neodymium (Nd), iridium (Jr), chromium (Cr), lithium (Li), calcium (Ca), molybdenum (Mo), titanium (Ti), tungsten (W), and copper (Cu). The gate electrode 140 may include a single layer or a plurality of layers.

An interlayer insulating layer 150 may be formed on the gate electrode 140. The interlayer insulating layer 150 may include a single layer or a plurality of layers including a material, such as at least one of silicon oxide and silicon nitride.

The source electrode 160 and the drain electrode 162 may be formed on the interlayer insulation layer 150. For example, the interlayer insulation layer 150 and the gate insulating layer 130 may be formed to expose the source region and the drain region of the active layer 120, and the source electrode 160 and the drain electrode 162 may contact the exposed source region and the exposed drain region of the active layer 120, respectively. Each of the source electrode 160 and the drain electrode 162 may include a single layer or a plurality of layers including a metal, such as at least one of aluminum (Al), platinum (Pt), palladium (Pd), silver (Ag), magnesium (Mg), gold (Au), nickel (Ni), neodymium (Nd), iridium (Jr), chromium (Cr), lithium (Li), calcium (Ca), molybdenum (Mo), titanium (Ti), tungsten (W), and copper (Cu).

Although FIG. 1 illustrates an example of a top gate-type thin-film transistor (TFT) including the active layer 120, the gate electrode 140, the source electrode 160, and the drain electrode 162 in the order stated, exemplary embodiments are limited thereto. For instance, a bottom gate-type thin film transistor in which the gate electrode 140 is disposed under the active layer 120 may be used, or a dual gate-type thin film transistor in which gate electrodes are disposed above and below the active layer 120 may be used.

A planarizing layer 170 may be formed on the source electrode 160 and the drain electrode 162. When an organic light-emitting device is disposed on the thin-film transistor TFT, the planarizing layer 170 planarizes a surface overlapping the thin-film transistor TFT and protects the thin-film transistors TFT and various other elements. The planarizing layer 170 may include an inorganic insulation film and/or an organic insulation film. The planarizing layer 170 may include at least one of $SiO_2$, $SiN_x$, $SiON$, $Al_2O_3$, $TiO_2$, $Ta_2O_5$, $HfO_2$, $ZrO_2$, BST, and PZT. The organic insulation film may include a general-purpose polymer (e.g., PMMA, PS, etc.), a polymer derivative including a phenol-based group, an acrylic polymer, an imide polymer, an arylether polymer, an amide polymer, a fluorine polymer, a p-xylene polymer, a vinyl alcohol polymer, and/or a blend thereof. The planarizing layer 170 may also be formed as a composite stacked structure of an inorganic insulation film and an organic insulation film.

Organic light-emitting devices formed in association with a first sub-pixel (or pixel) 250R, a second sub-pixel (or pixel) 250G, and a third sub-pixel (or pixel) 250B may be formed on the planarizing layer 170. For example, the first sub-pixel 250R may be a red sub-pixel, the second sub-pixel 250G may be a green sub-pixel, and the third sub-pixel 250B may be a blue sub-pixel. The first sub-pixel 250R may include the first pixel electrode 210R, a first intermediate layer 220R, and a first counter electrode 230R. The second sub-pixel 250G may include the second pixel electrode 210G, a second intermediate layer 220G, and a second counter electrode 230G. The third sub-pixel 250B may include the third pixel electrode 210B, a third intermediate layer 220B, and a third counter electrode 230B.

A common electrode 240, which is formed as a single body with respect to the plurality of sub-pixels 250R, 250G, and 250B and corresponds to the plurality of sub-pixels 250R, 250G, and 250B, may be disposed on the first counter electrode 230R, the second counter electrode 230G, and the third counter electrode 230B.

In some exemplary embodiments, the first, second, and third pixel electrodes 210R, 210G, and 210B may be formed on the planarizing layer 170, may be respectively connected to the thin-film transistors TFT through contact holes formed in the planarizing layer 170, and may each be formed as a transparent electrode or a reflective electrode. When the first through third pixel electrodes 210R, 210G, and 210B are formed as transparent electrodes, the first through third pixel electrodes 210R, 210G, and 210B may include at least one of IZO, ZnO, $In_2O_3$, IGO, and AZO. When the first through third pixel electrodes 210R, 210G, and 210B are formed as reflective electrodes, each of the first through third pixel electrodes 210R, 210G, and 210B may include a reflective film including at least one of Ag, Mg, Al, Pt, Pd, Au, Ni, Nd, Jr, and Cr, and a layer including at least one of ITO, IZO, ZnO, $In_2O_3$, IGO, and AZO. According to some exemplary embodiments, the first through third pixel electrodes 210R, 210G, 210B may be reflective electrodes and include an ITO/Ag/ITO structure.

However, exemplary embodiments are not limited thereto, and various modifications may be made to a pixel electrode structure. For example, the first through third pixel electrodes 210R, 210G, and 210B may include various materials, and the structure thereof may include a single layer structure or a multilayered structure.

The pixel defining layer 180 is formed on the first through third pixel electrodes 210R, 210G, and 210B. The pixel defining layer 180 may include one or more organic insulation materials selected from a group consisting of polyimide, polyamide, an acrylic resin, benzocyclobutene, and a phenol resin. The pixel defining layer 180 may be formed using any suitable method, such as spin coating. The pixel defining layer 180 is formed to expose the center portions of the first through third pixel electrode 210R, 210G, 210B, and cover the edge portions of the first through third pixel electrode 210R, 210G, 210B.

The pixel defining layer 180 increases a distance between the respective edges of the first, second, and third pixel electrodes 210R, 210G, and 210B and the first, second, and third counter electrodes 230R, 230G, and 230B on the first, second, and third pixel electrodes 210R, 210G, and 210B. In this manner, the pixel defining layer 180 prevents an arc from being generated at the edges of the first, second, and third pixel electrodes 210R, 210G, and 210B.

The first, second, and third intermediate layers 220R, 220G, and 220B including respective emission layers are disposed in regions where the first, second, and third pixel electrodes 210R, 210G, and 210B are exposed by the pixel defining layer 180. The first, second, and third counter electrodes 230R, 230G, and 230B are disposed on the intermediate layers 220R, 220G, and 220B. As a result, light is emitted by the intermediate layers 220R, 220G, and 220B between the first, second, and third pixel electrodes 210R, 210G, and 210B and the first, second, and third counter electrodes 230R, 230G and 230B, and, thus, pixel regions are defined by the pixel defining layer 180.

The first intermediate layer 220R, the second intermediate layer 220G, and the third intermediate layer 220B respectively included in the first sub-pixel 250R, the second sub-pixel 250G, and the third sub-pixel 250B are formed in the pixel regions defined by the pixel defining layer 180. The first intermediate layer 220R, the second intermediate layer 220G, and the third intermediate layer 220B may include emission layers emitting red light, green light, and blue light, respectively; however, it is contemplated that white light or any suitable combination of color lights may be utilized. Furthermore, although not illustrated, the first intermediate layer 220R, the second intermediate layer 220G and the third intermediate layer 220B may be formed by stacking a hole injection layer, a hole transport layer, an electron transport layer, and an electron injection layer in a single structure or a composite structure, and may also have various other structures. The first intermediate layer 220R, the second intermediate layer 220G, and the third intermediate layer 220B may further include metal films including, for example, Ag and Mg at topmost portions thereof.

Hereinafter, a method of forming the first intermediate layer 220R, the second intermediate layer 220G, and the third intermediate layer 220B on the substrate 100 having formed thereon, the first, second, and third pixel electrodes 210R, 210G, and 210B will be described in more detail.

Figure 2:
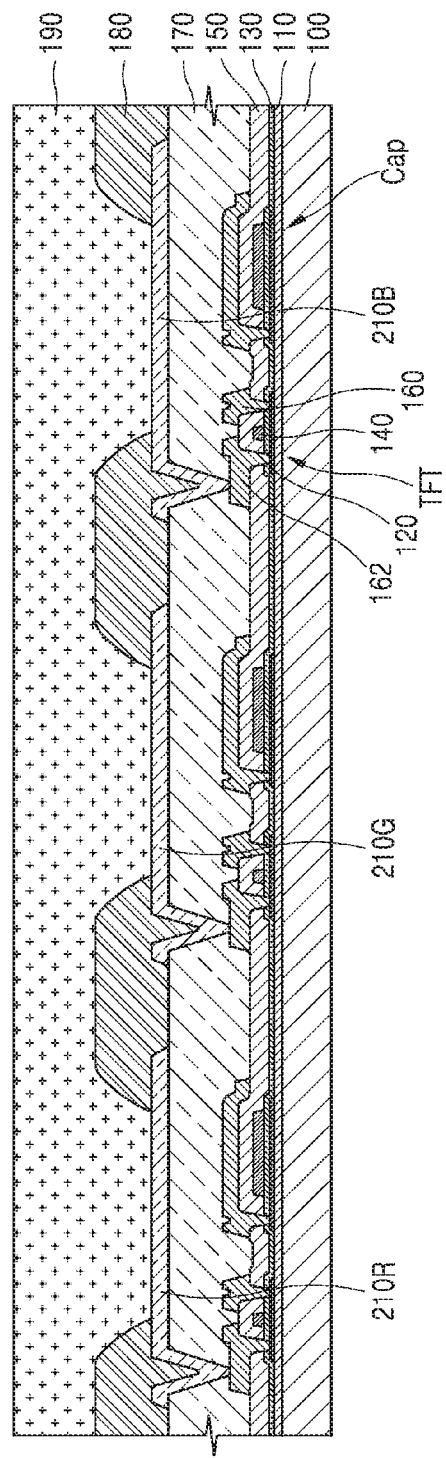
FIGS. 2 through 11 are schematic cross-sectional views of the organic light-emitting display device of FIG. 1 at various stages of manufacture according to some exemplary embodiments.
Figure 3:
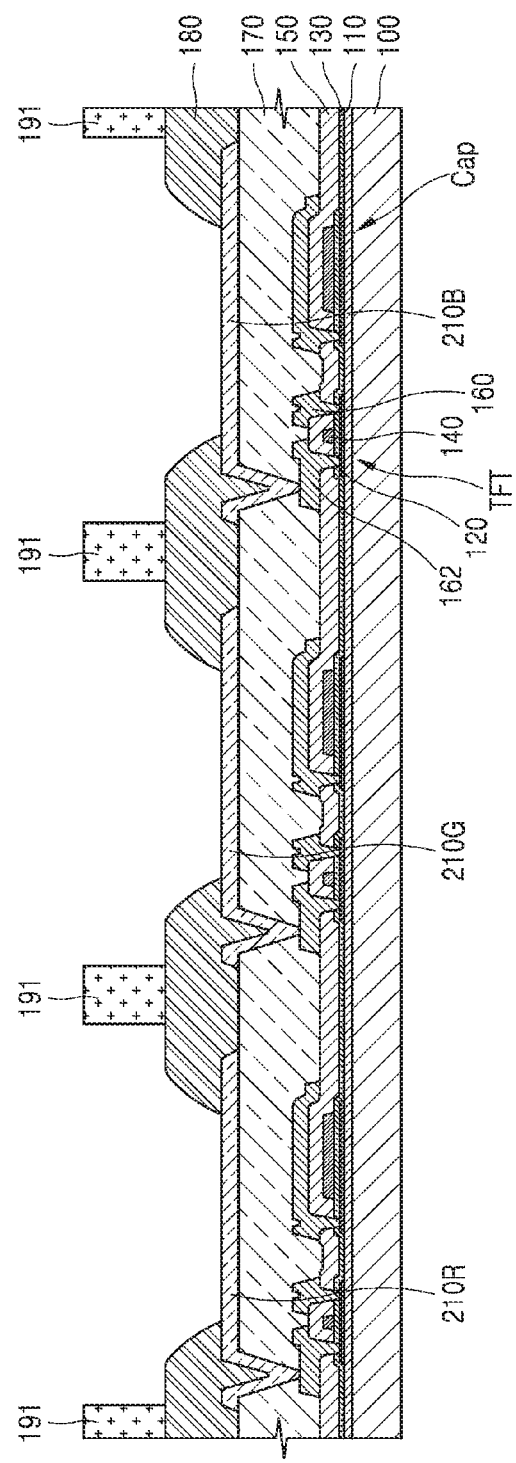

First, as shown in FIGS. 2 and 3, a sacrificial layer 190 including a first resin is formed on the substrate 100 so as to cover the first, second, and third pixel electrodes 210R, 210G, and 210B. Next, the sacrificial layer 190 is patterned to form the partitioning walls 191 arranged to correspond to the top surface of the pixel defining layer 180.

As shown in FIG. 2, the sacrificial layer 190 is formed on the entire surface of the substrate 100, a photoresist layer (not shown) is formed on the sacrificial layer 190, and a portion of the photoresist layer is exposed and developed, thereby forming a patterned photoresist layer (not illustrated) at portions where the partitioning walls 191 are to be formed. The sacrificial layer 190 may be patterned using the patterned photoresist layer, thereby forming the partitioning walls 191, as shown in FIG. 3. Next, the photoresist layer disposed on the partitioning walls 191 is removed.

The first resin, which is a material constituting the sacrificial layer 190 and the partitioning walls 191, may be a material obtained by mixing a solvent with a resin that matches characteristics of the solvent. The first resin may be any one of a fluorous solvent-based resin obtained by mixing a fluorine solvent with a resin, a hydroxylic solvent-based resin obtained by mixing a hydroxyl solvent with a resin, and a non-polar organic solvent-based resin obtained by mixing a non-polar organic solvent with a resin. On the other hand, when a solvent containing no fluorine is used, the first resin may be considered a non-fluorous solvent-based resin. In other words, a hydroxyl-based resin and a non-polar organic solvent-based resin belong to non-fluorous solvent-based resins may be used. When the first resin is a fluorous solvent-based resin, the first resin may contain from 75 wt % to 95 wt % of fluoroether obtained by substituting some hydrogen atoms with fluorine atoms in an ether structure and from 5 wt % to 25 wt % of a resin polymer, but exemplary embodiments are not limited thereto.

After the partitioning walls 191 are formed, the partitioning walls 191 are baked at a high temperature, thereby removing a residual solvent included in the partitioning walls 191. When a residual solvent in the partitioning wall 191 remains, oxygen released as molecular bonding of the residual solvent is broken, may damage the first through third intermediate layers 220R, 220G, and 220B. Therefore, according to some exemplary embodiments, in order to prevent such damage, a residual solvent in the partitioning walls 191 may be removed through a baking process.

The partitioning walls 191 are formed before the first intermediate layer 220R, the second intermediate layer 220G, and the third intermediate layer 220B are formed, and, thus, a temperature for baking the partitioning walls 191 may be set to be higher than a thermal damage temperature of an organic material included in the first intermediate layer 220R, the second intermediate layer 220G, and the third intermediate layer 220B. The baking temperature may be set to a temperature above a characteristic of the first resin, e.g., the boiling point. According to some exemplary embodiments, the baking temperature of the partitioning walls 191 may be set to be greater than or equal to 100° C., such as greater than or equal to 150° C.

When a second mask layer 420 (described below) is formed without forming the partitioning walls 191, since the second mask layer 420 is formed after the first intermediate layer 220R is formed, the first intermediate layer 220R may be damaged when a baking process of the second mask layer 420 is performed at a temperature higher than the thermal damage temperature of the first intermediate layer 220R. When, however, a baking process is performed at a temperature lower than the thermal damage temperature of the first intermediate layer 220R, the residual solvent in the second mask layer 420 may not be removed. Therefore, the first through third intermediate layers 220R, 220G, and 220B may be damaged by the residual solvent in the second mask layer 420.

According to various exemplary embodiments, however, the partitioning walls 191 are baked prior to formation of the first through third intermediate layers 220R, 220G, and 220B. Also, the first mask layer 410 and the second mask layer 420, which are not baked, are separate from the first through third intermediate 220R, 220G, and 220B during a manufacturing process, and, thus, the first through third intermediate 220R, 220G, and 220B may be prevented from being damaged by the residual solvent that may remain in the first mask layer 410 and the second mask layer 420.

Figure 4:
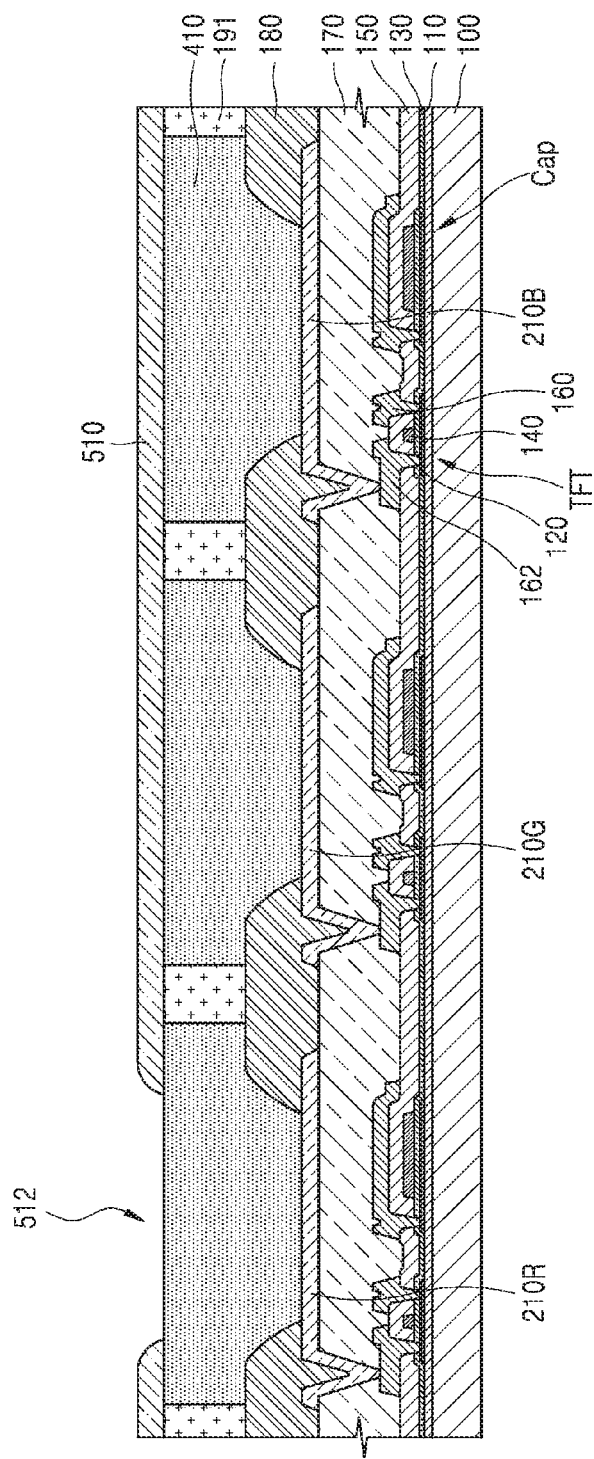
Figure 5:
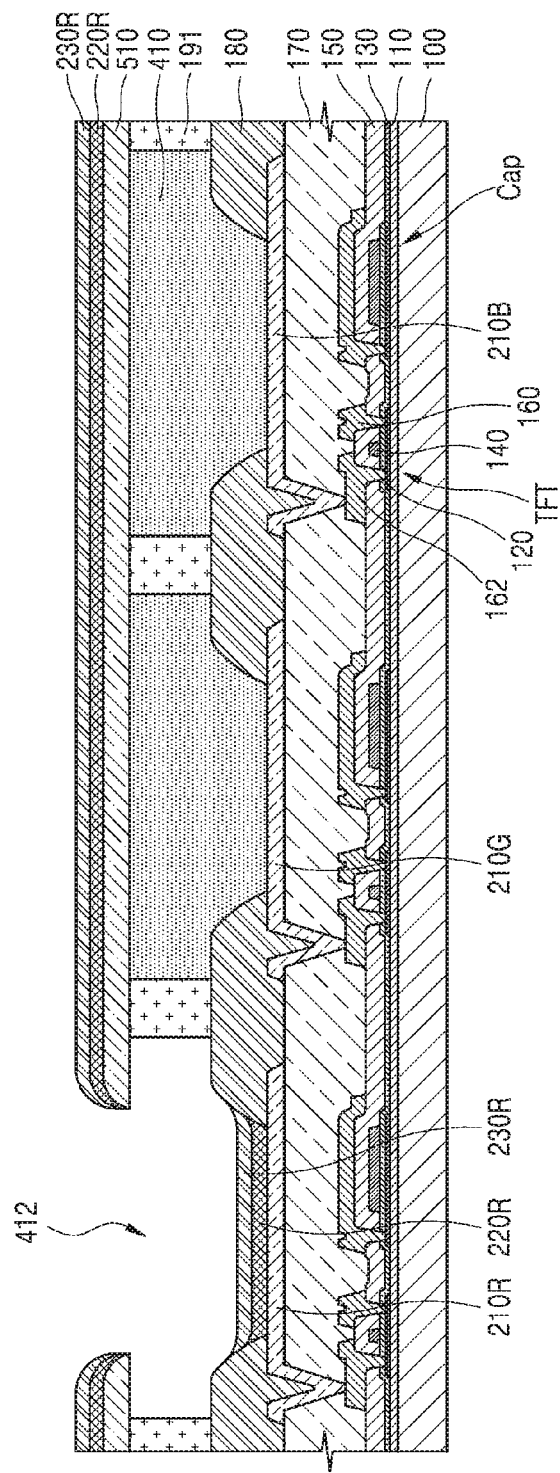

Next, as shown in FIGS. 4 and 5, the first mask layer 410 filling the space between the partitioning walls 191 and exposing the first pixel electrode 210R is formed, and then, the first intermediate layer 220R is formed on the first pixel electrode 210R.

The first mask layer 410 includes a first exposed portion 412 that exposes the first pixel electrode 210R. The first exposed portion 412 may correspond to a space formed as the first sub-pixel 250R (see FIG. 1) is separated by the partitioning walls 191. Therefore, the first mask layer 410 may be blocked by the partitioning wall 191 from the first pixel electrode 210R and the first intermediate layer 220R to be formed later.

The first exposed portion 412 may be formed by applying a first photosensitive resin layer 510 on the first mask layer 410, forming a first opening 512 by partially exposing and etching the first photosensitive resin layer 510, and etching a portion of first mask layer 410 through the first opening 512. The first exposed portion 412 may be formed by, for instance, wet-etching the first mask layer 410 using a stripper capable of selectively removing the first mask layer 410. Since the first exposed portion 412 may be formed via a wet etching process as described above, the first exposed portion 412 may be formed to be larger than the first opening 512 and may correspond to the space separated by the partitioning walls 191.

The first mask layer 410 may include a second resin having a property different from that of the first resin. In other words, the second resin has a property (e.g., etching selectivity) orthogonal to that of the first resin, and, thus, the first resin is not removed by a stripper capable of removing the second resin. Here, since the first resin and the second resin have properties orthogonal to each other, the second resin may not react with a material that reacts with the first resin. Therefore, during the formation of the first exposed portion 412 of the first mask layer 410, the partitioning wall 191 is not removed. For example, when a fluorous solvent-based resin is selected as the first resin, a non-fluorous solvent-based resin may be selected as the second resin. Alternatively, when a non-fluorous solvent-based resin is selected as the first resin, a fluorous solvent-based resin may be selected as the second resin. In some exemplary embodiments, the first resin and the second resin may be different resins selected from among a fluorous solvent-based resin, a hydroxyl solvent-based resin, and a non-polar organic solvent-based resin.

Next, the first intermediate layer 220R is formed to correspond to the entire area of the substrate 100 using a method like a thermal evaporation method. Therefore, the first intermediate layer 220R may be formed not only on the first pixel electrode 210R, but also on the first photosensitive resin layer 510. The first intermediate layer 220R includes an emission layer and may include a hole injection layer, a hole transport layer, an electron transport layer, and an electron injection layer that are stacked in a single layer structure or a composite structure.

The first counter electrode 230R may be formed to cover the first intermediate layer 220R. The first counter electrode 230R may be formed not only on the first intermediate layer 220R, but also on the first photosensitive resin layer 510. The first counter electrode 230R may be formed as a transparent electrode or a reflective electrode.

The first counter electrode 230R may cover the first intermediate layer 220R and prevent damage to the first intermediate layer 220R during operations described below. Also, since a common electrode 240 described below may serve as a counter electrode, formation of the first counter electrode 230R may be omitted in the present operation, and a blocking layer including an inorganic material or an organic material capable of protecting the first intermediate layer 220R may be formed instead of the first counter electrode 230R. The blocking layer may be removed before the common electrode 240 described below is formed.

When the first counter electrode 230R or the blocking layer is provided, a first protection layer 291 (described below) does not directly contact the first intermediate layer 220R, and, thus, the first intermediate layer 220R may not be damaged by a residual solvent in the first protection layer 291.

Figure 6:
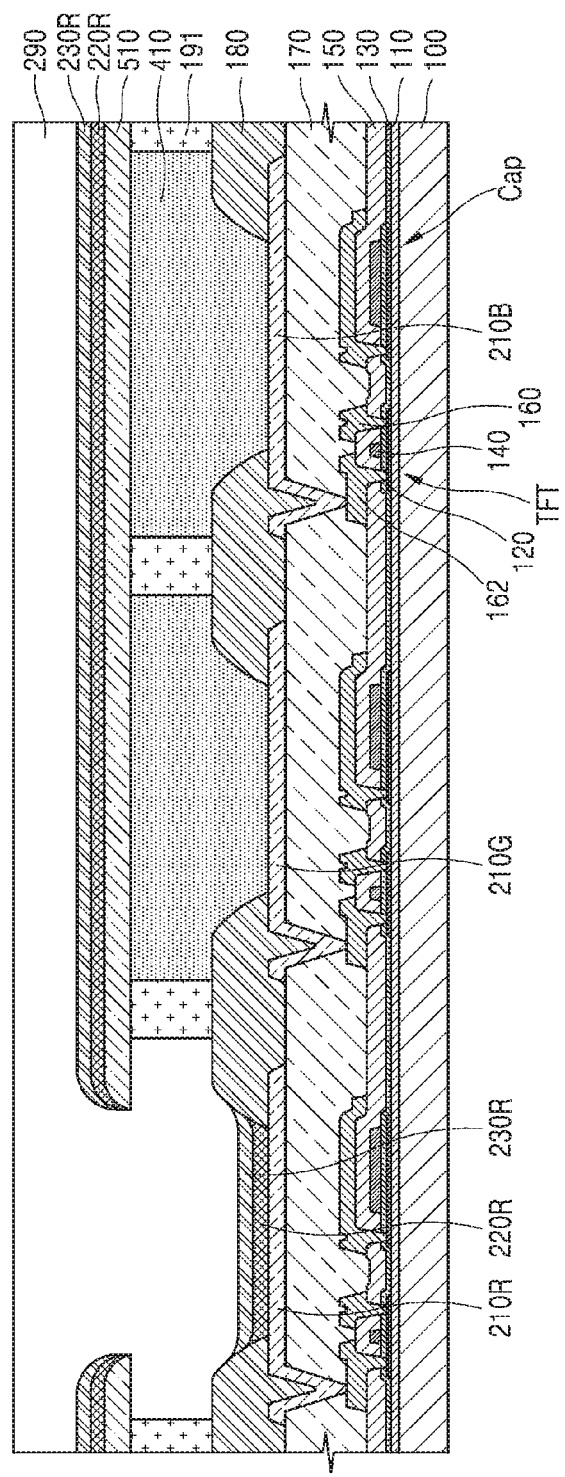
Figure 7:
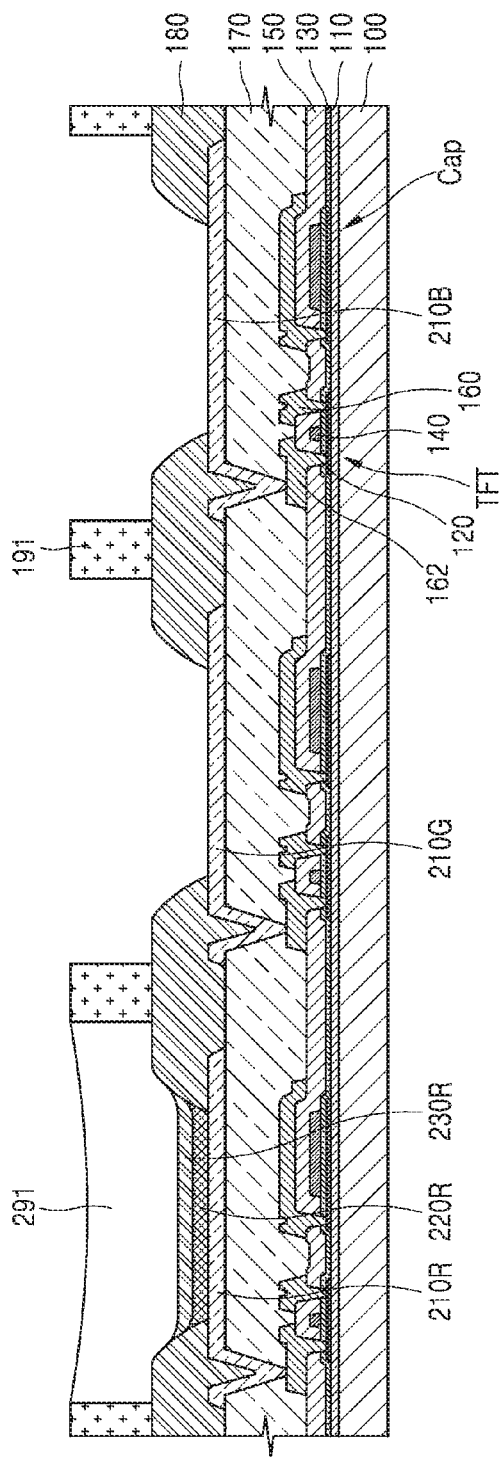

Next, referring to FIGS. 6 and 7, the first protection layer 291 protecting the first intermediate layer 220R may be formed. The first protection layer 291 prevents the first intermediate layer 220R from being exposed to the process environment during the formation of the second intermediate layer 220G (see FIG. 1) and the formation of the third intermediate layer 220B (see FIG. 1), thereby preventing the first intermediate layer 220R from being damaged.

The first protection layer 291 may include a material having the same properties as those of the first resin constituting the partitioning wall 191. The first protection layer 291 may be formed by coating a spare (or prior) first protection layer 290 on the entire surface of the substrate 100 and removing the spare first protection layer 290 using a stripper until the first photosensitive resin layer 510 is exposed.

Next, the first photosensitive resin layer 510 and the first mask layer 410 are removed. Since the first mask layer 410 has properties orthogonal to those of the partitioning wall 191 and the first protection layer 291, the partitioning wall 191 and the first protection layer 291 are not removed by a stripper that removes the first mask layer 410.

Figure 8:
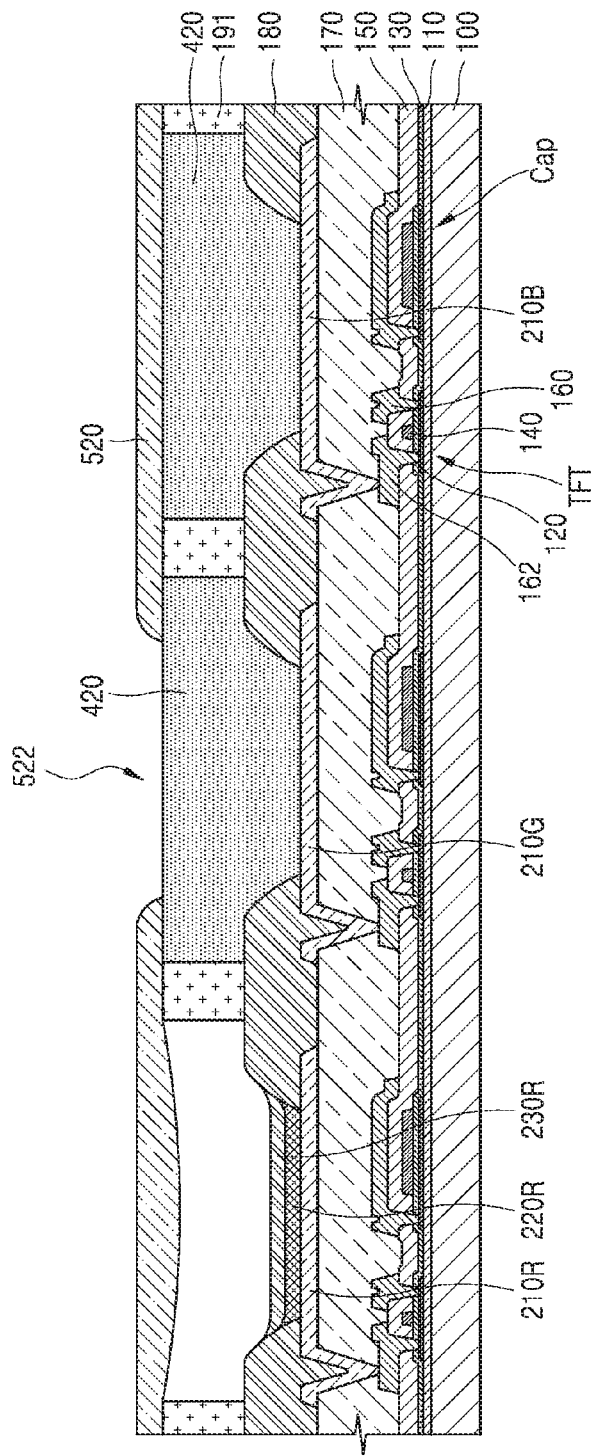
Figure 9:
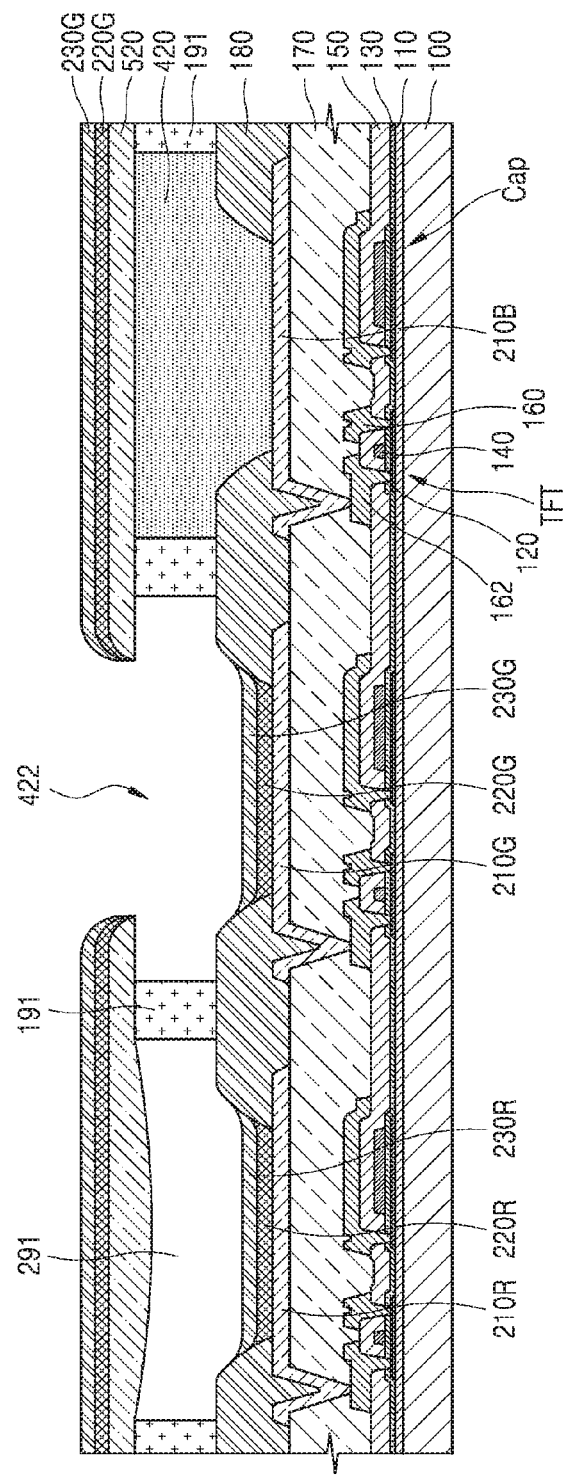

Next, as shown in FIGS. 8 and 9, the second mask layer 420 filling the spaces between the partitioning walls 191 and exposing the second pixel electrode 210G is formed, and then the second intermediate layer 220G is formed on the second pixel electrode 210G. The second mask layer 420 includes a second exposed portion 422 that exposes the second pixel electrode 210G. The second exposed portion 422 may correspond to the space formed as the second sub-pixel 250G (see FIG. 1) that is separated by the partitioning walls 191. Therefore, the second mask layer 420 may be blocked by the partitioning wall 191 from the second pixel electrode 210G and the second intermediate layer 220R to be formed later.

The second exposed portion 422 may be formed by applying a second photosensitive resin layer 520 on the second mask layer 420, forming a second opening 522 by partially exposing and etching the second photosensitive resin layer 520, and etching the second mask layer 420 through the second opening 522. In this case, the second exposed portion 422 may be formed by wet-etching the second mask layer 420 using a stripper capable of selectively removing the second mask layer 420. Since the second exposed portion 422 may be formed via a wet-etching process as described above, the second exposed portion 422 may be formed to be larger than the second opening 522 and may correspond to the space separated by the partitioning walls 191.

The second mask layer 420 may include a third resin having a property different from that of the first resin. In other words, the third resin has a property orthogonal to that of the first resin, and, thus, the first resin is not removed by a stripper capable of removing the third resin. Here, since the first resin and the third resin have properties orthogonal to each other, the third resin may not react with a material that reacts with the first resin. Therefore, during the formation of the second exposed portion 422 of the second mask layer 420, the partitioning wall 191 is not removed. In other words, when a fluorous solvent-based resin is selected as the first resin, a non-fluorous solvent-based resin may be selected as the third resin. Alternatively, when a non-fluorous solvent-based resin is selected as the first resin, a fluorous solvent-based resin may be selected as the third resin. According to some exemplary embodiments, the first resin and the third resin may be different ones selected from among a fluorous solvent-based resin, a hydroxyl solvent-based resin, and a non-polar organic solvent-based resin.

Next, the second intermediate layer 220G is formed to correspond to the entire area of the substrate 100 using a method like a thermal evaporation method. Therefore, the second intermediate layer 220G may be formed not only on the second pixel electrode 210G, but also on the second photosensitive resin layer 520. The second intermediate layer 220G includes an emission layer and may include a hole injection layer, a hole transport layer, an electron transport layer, and an electron injection layer that are stacked in a single layer structure or a composite structure.

A second counter electrode 230G may be formed to cover the second intermediate layer 220G. The second counter electrode 230G may be formed not only on the second intermediate layer 220G in the second exposed portion 422, but also on the second photosensitive resin layer 520. The second counter electrode 230G may cover the second intermediate layer 220G and prevent damage to the second intermediate layer 220G during operations described below. Also, since the common electrode 240 (described below) may serve as a counter electrode, formation of the second counter electrode 230G may be omitted in the present operation, and a blocking layer capable of protecting the second intermediate layer 220G may be disposed instead of the second counter electrode 230G. When the second counter electrode 230G or the blocking layer is used, a second protection layer 292 (described below) does not directly contact the second intermediate layer 220G, and, thus, the second intermediate layer 220G may not be damaged by a residual solvent in the second protection layer 292.

Figure 10:
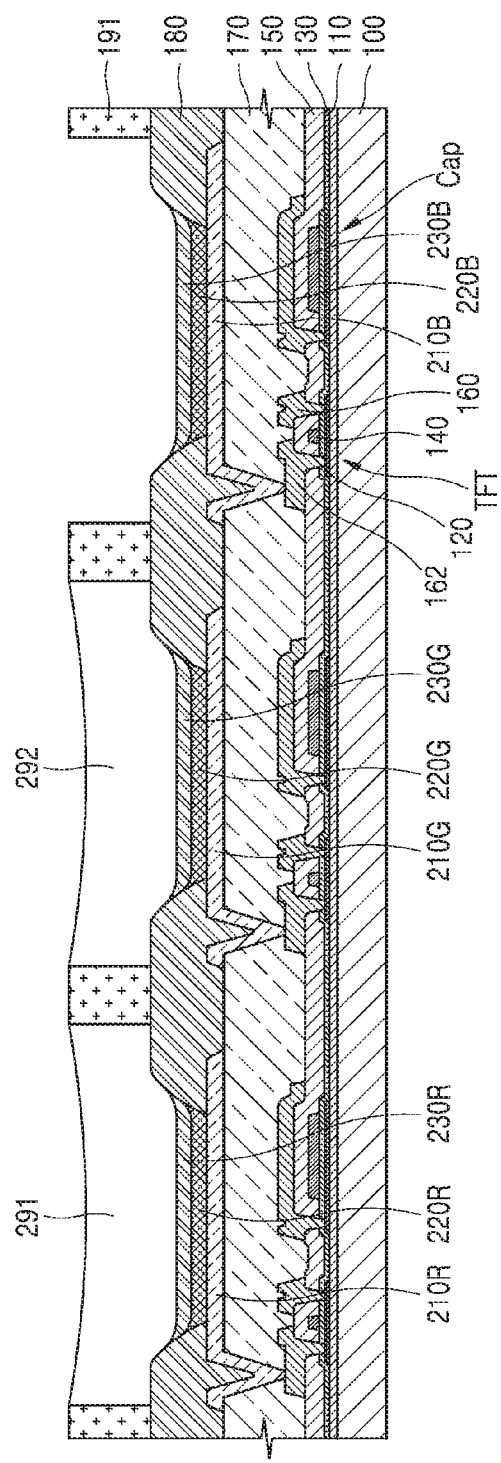

Next, referring to FIG. 10, the second protection layer 292 protecting the second intermediate layer 220G is formed, and the third intermediate layer 220B is formed. The second protection layer 292 prevents the second intermediate layer 220G from being exposed to the process environment during the formation of the third intermediate layer 220B (see FIG. 1), thereby preventing the second intermediate layer 220G from being damaged.

The second protection layer 292 may include a material having the same properties as those of the first resin constituting the partitioning wall 191. In a manner similar to the formation of the first protection layer 291, the second protection layer 292 may be formed by coating a spare-first protection layer on the entire surface of the substrate 100 and removing the spare-first protection layer 290 using a stripper until the second photosensitive resin layer 520 is exposed. Next, the second photosensitive resin layer 520 and the second mask layer 420 are removed. Since the second mask layer 420 has properties orthogonal to those of the partitioning wall 191, the first protection layer 291, and the second protection layer 292, the partitioning wall 191 and the second protection layer 292 are not removed by a stripper that removes the second mask layer 420.

Next, the third intermediate layer 220B is formed on the exposed third pixel electrode 210B. Like the formation of the second intermediate layer 220G, the third intermediate layer 220B may be formed by forming a third mask layer (not shown) exposing the third pixel electrode 210B and depositing the third intermediate layer 220B. However, exemplary embodiments are not limited thereto. The first intermediate layer 220R and the second intermediate layer 220G are respectively covered by the first protection layer 291 and the second protection layer 292, and the first protection layer 291 and the second protection layer 292 are removed later. Therefore, the third intermediate layer 220B may be deposited without forming a third mask layer. The third intermediate layer 220B includes an emission layer and may include a hole injection layer, a hole transport layer, an electron transport layer, and an electron injection layer that are stacked in a single layer structure or a composite structure.

Next, a third counter electrode 230B may be formed to cover the third intermediate layer 220B. Also, since the common electrode 240 (described below) may serve as a counter electrode, formation of the third counter electrode 230B may be omitted in the present operation.

Figure 11:
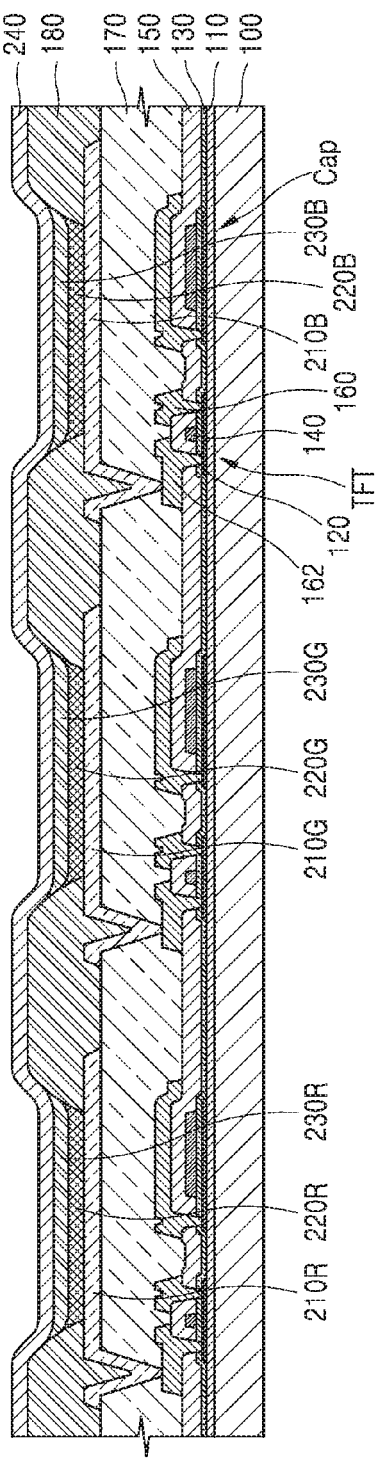

Next, referring to FIG. 11, after the partitioning wall 191, the first protection layer 291, and the second protection layer 292 are removed, the common electrode 240 is formed. Since the partitioning wall 191, the first protection layer 291, and the second protection layer 292 include resins having same properties, the partitioning wall 191, the first protection layer 291, and the second protection layer 292 may be removed using a same stripper. For example, when the partitioning wall 191, the first protection layer 291, and the second protection layer 292 include fluorous solvent-based resins, a fluoro solvent-based etchant may be used as the stripper.

Next, the common electrode 240 is formed over the entire surface of the substrate 100. In other words, the common electrode 240 is formed in common to the first through third sub-pixels 250R, 250G, and 250B. When the first through third counter electrodes 230R, 230G, and 230B are disposed, the common electrode 240 may directly contact the first through second counter electrodes 230R, 230G, and 230B.

The first through third counter electrodes 230R, 230G, and 230B and the common electrode 240 may include transparent electrodes or reflective electrodes. When the first through third counter electrodes 230R, 230G, and 230B and the common electrode 240 include transparent electrodes, each of the first through third counter electrodes 230R, 230G, and 230B and the common electrode 240 may include a layer containing a metal having a low work function, that is, at least one of Li, Ca, LiF/Ca, LiF/Al, Al, Ag, Mg, and a compound thereof, and a transparent conductive layer including at least one of ITO, IZO, ZnO, and $In_2O_3$. When the first through third counter electrodes 230R, 230G, and 230B and the common electrode 240 include reflective electrodes, each of the first through third counter electrodes 230R, 230G, and 230B and the common electrode 240 may include a layer containing at least one of Li, Ca, LiF/Ca, LiF/Al, Al, Ag, Mg, and a compound thereof. Of course, the configuration and the material of the counter electrode 230 are not limited thereto, and various modifications may be made therein. To this end, at least one of the first through third counter electrodes 230R, 230G, and 230B and the common electrode 240 may have a single layer or multilayer structure.

Referring back to FIG. 1, a thin-film encapsulation layer 300 capable of preventing external oxygen and moisture from permeating into a display layer 200 by sealing the display layer 200, may be formed on the counter electrode 240. The thin-film encapsulation layer 300 may include at least one inorganic film, for example, first and second one inorganic films 310 and 330, and at least one organic film 320. For example, the thin-film encapsulation layer 300 may include the first inorganic film 310, an organic film 320, and the second inorganic film 330 sequentially stacked, as shown in FIG. 1. However, exemplary embodiments are not limited thereto, and various configurations may be employed.

The first inorganic film 310 and the second inorganic film 330 may include one or more materials selected from among silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON). The organic film 320 may include one or more materials selected from among an acrylic resin, a methacrylic resin, polyisoprene, a vinyl resin, an epoxy resin, a urethane resin, a cellulose resin, and a perylene resin.

Although FIG. 1 shows an example in which the thin-film encapsulation layer 300 is formed on the common electrode 240, exemplary embodiments are not limited thereto. In other words, the organic light-emitting display device 10 may include a sealing substrate (not shown) instead of (or in addition to) the thin-film encapsulation layer 300. The sealing substrate (not shown) may be bonded to the substrate 100 via a sealing glass frit and a sealing member, thereby blocking external moisture and air.

According to various exemplary embodiments, since a partitioning wall baked at a high temperature prior to formation of an intermediate layer including an emission layer of an organic light-emitting display device is provided, damage to the intermediate layer may be prevented. Therefore, the reliability of the organic light-emitting display device may be improved. Of course, exemplary embodiments are not limited to or by these effects.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A method of manufacturing an organic light-emitting display device, the method comprising:
    preparing a substrate comprising pixel electrodes;
    forming a pixel defining layer on the substrate, the pixel defining layer exposing a central portion of each of the pixel electrodes and covering an edge portion of each of the pixel electrodes;
    forming partitioning walls in correspondence with at least a portion of an upper surface of the pixel defining layer, the partitioning walls comprising a first resin;
    removing a solvent in the partitioning walls by baking the partitioning walls;
    forming a first mask layer filling a space between the partitioning walls and exposing a first pixel electrode among the pixel electrodes, the first mask layer comprising a second resin; and
    forming a first intermediate layer on the first pixel electrode.

2. The method of claim 1, wherein a temperature for baking the partitioning walls is greater than a thermal damage temperature of the first intermediate layer.

3. The method of claim 1, wherein a material property of the second resin is orthogonal to a material property of the first resin.

4. The method of claim 1, wherein one of the first resin and the second resin is a fluorous solvent-based resin and the other one of the first resin and the second resin is a non-fluorous solvent-based resin.

5. The method of claim 1, wherein the first resin and the second resin are different resins from among a fluorous solvent-based resin, a hydroxylic solvent-based resin, and a non-polar organic solvent-based resin.

6. The method of claim 1, further comprising:
    removing the first mask layer;
    forming a second mask layer filling a space between the partitioning walls and exposing a second pixel electrode from among the pixel electrodes that is different from the first pixel electrode, the second mask layer comprising a third resin; and
    forming a second intermediate layer on the second pixel electrode.

7. The method of claim 6, wherein a material property of the third resin is orthogonal to a material property of the first resin.

8. The method of claim 6, further comprising:
    forming, before removing the first mask layer, a first counter electrode on the substrate, the first counter electrode covering the first intermediate layer.

9. The method of claim 6, further comprising:
    forming, before removing the first mask layer, a first protection layer on the first intermediate layer, a material property of the first protection layer being equivalent to a material property of the first resin.

10. The method of claim 6, further comprising:
    removing the second mask layer; and
    forming a third intermediate layer on a third pixel electrode, the third pixel electrode being different than the first pixel electrode and the second pixel electrode.

11. A method of manufacturing an organic light-emitting display device, the method comprising:
    preparing a substrate comprising pixel electrodes;
    forming a pixel defining layer on the substrate, the pixel defining layer exposing a central portion of each of the pixel electrodes and covering an edge portion of each of the pixel electrodes;
    forming partitioning walls in correspondence with at least a portion of an upper surface of the pixel defining layer, the partitioning walls comprising a first resin;
    baking the partitioning walls;
    forming a first mask layer filling a space between the partitioning walls and exposing a first pixel electrode among the pixel electrodes, the first mask layer comprising a second resin;
    forming, after forming the first mask layer, a first intermediate layer and a first counter electrode on the first pixel electrode;
    removing the first mask layer after forming the first intermediate layer and the first counter electrode on the first pixel electrode;
    forming, after removing the first mask layer, a second mask layer filling a space between the partitioning walls and exposing a second pixel electrode among the pixel electrodes that is different from the first pixel electrode, the second mask layer comprising a third resin; and
    forming, after forming the second mask layer, a second intermediate layer and a second counter electrode on the second pixel electrode.

12. The method of claim 11, wherein a temperature for baking the partitioning walls is greater than a thermal damage temperature of the first intermediate layer.

13. The method of claim 11, wherein a material property of the second resin is orthogonal to a material property of the first resin.

14. The method of claim 11, wherein the first resin is a fluorous solvent-based resin and the third resin is a non-fluorous solvent-based resin.

15. The method of claim 11, further comprising:
    removing the second mask layer after forming the second intermediate layer and the second counter electrode on the second pixel electrode; and
    forming, after removing the second mask layer, a third intermediate layer and a third counter electrode on a third pixel electrode among the pixel electrodes, the third pixel electrode being different from the first pixel electrode and the second pixel electrode.

16. The method of claim 15, further comprising:
    forming a common electrode covering the first counter electrode, the second counter electrode, and the third counter electrode.

17. The method of claim 16, further comprising:
    forming a thin-film encapsulation layer on the common electrode.

18. The method of claim 11, wherein at least some of the partitioning walls separate the first mask layer and the second mask layer from the first intermediate layer and the second intermediate layer, respectively.

19. The method of claim 11, further comprising:
    forming, before removing the first mask layer, a first protection layer on the first intermediate layer, a material property of the first protection layer being equivalent to a material property of the first resin.

20. The method of claim 11, wherein:
    the substrate comprises thin-film transistors; and
    each pixel electrode among the pixel electrodes is connected to a thin-film transistor among the thin-film transistors.

* * * * *